United States Patent
Donthireddy et al.

(10) Patent No.: US 11,516,883 B2
(45) Date of Patent: Nov. 29, 2022

(54) MODULAR 5G FIXED WIRELESS ACCESS DEVICE

(71) Applicant: Inseego Corp., San Diego, CA (US)

(72) Inventors: Vishal Donthireddy, San Diego, CA (US); Ashish Sharma, San Diego, CA (US); Pedro Gutierrez, San Diego, CA (US); Bill Babbitt, San Diego, CA (US); Todd Conklin, San Diego, CA (US); Sean Kim, San Diego, CA (US)

(73) Assignee: Inseego Corp., San Diego, CA (US)

( * ) Notice: Subject to any disclaimer, the term of this patent is extended or adjusted under 35 U.S.C. 154(b) by 0 days.

(21) Appl. No.: 16/983,996

(22) Filed: Aug. 3, 2020

(65) Prior Publication Data

US 2022/0039205 A1 Feb. 3, 2022

(51) Int. Cl.
*H04W 88/08* (2009.01)
*H04L 12/10* (2006.01)
*H05K 5/02* (2006.01)
*H05K 7/20* (2006.01)

(52) U.S. Cl.
CPC ............. *H04W 88/08* (2013.01); *H04L 12/10* (2013.01); *H05K 5/0217* (2013.01); *H05K 7/2039* (2013.01)

(58) Field of Classification Search
CPC ..... H04W 88/08; H04L 12/10; H05K 5/0217; H05K 7/2039
USPC ........................................................ 455/557
See application file for complete search history.

(56) References Cited

U.S. PATENT DOCUMENTS

| | | | |
|---|---|---|---|
| 2002/0078291 A1* | 6/2002 | Sutton | B60R 11/0252 710/302 |
| 2005/0047079 A1* | 3/2005 | Gasbarro | G06F 1/1632 361/679.4 |
| 2007/0225867 A1* | 9/2007 | Moorer | H04L 12/2814 700/276 |
| 2011/0283122 A1 | 11/2011 | Ohara | |
| 2012/0155015 A1* | 6/2012 | Govindasamy | H01L 23/36 361/688 |
| 2014/0362837 A1 | 12/2014 | Yang | |
| 2015/0256665 A1 | 9/2015 | Pera | |
| 2018/0288898 A1 | 10/2018 | Jeong | |
| 2018/0293407 A1* | 10/2018 | Wu | G06F 21/78 |
| 2019/0028594 A1 | 1/2019 | Persoons | |
| 2019/0046056 A1* | 2/2019 | Khachaturian | A61B 5/0816 |
| 2019/0341674 A1 | 11/2019 | Rosenthal | |
| 2020/0411410 A1* | 12/2020 | Klein | H01L 23/427 |

* cited by examiner

*Primary Examiner* — Ted M Wang
(74) *Attorney, Agent, or Firm* — Sheppard, Mullin, Richter & Hampton LLP; Hector A. Agdeppa; Daniel N. Yannuzzi

(57) ABSTRACT

A modular fixed wireless access (FWA) radio dock system is provided that allows docking of a single radio module that can be installed in multiple, different locations by connecting to any one of a plurality of docks and/or communication accessories. The radio module can be paired with different types/configurations of docking stations that include various connectivity ports that provide connectivity to a local network, a wired/wireless router, or other networking equipment. The docking stations can comprise both indoor and outdoor docking stations usable with the same radio module, and may include heat sink assemblies and/or fans that work in conjunction with heat sink assemblies of the radio module, as well as effectuate environmental sealing.

15 Claims, 10 Drawing Sheets

MODULAR 5G FIXED WIRELESS ACCESS DEVICE

DESCRIPTION OF RELATED ART

Wireless communications have become ubiquitous in today's society as wireless systems capabilities increase so does the adoption rate of wireless technologies. Today, wireless technologies are fast overtaking and replacing conventional wired technologies and infrastructure.

BRIEF SUMMARY OF THE DISCLOSED TECHNOLOGY

According to an embodiment of the disclosed technology, a fixed wireless access (FWA) device may comprise a radio module. The radio module may comprise wireless communication circuitry, a universal dock connector, and a first heat sink assembly. The FWA device may further comprise a dock. The dock may comprise a radio module connector adapted to operatively connect to the universal dock connector providing data transmission and reception between the wireless communication circuitry and an associated communications device. The dock may further comprise a second heat sink assembly operatively connecting to the first heat sink assembly creating an environmental seal therebetween.

In some embodiments, the radio module comprises a 5G modem.

In some embodiments, the dock may further comprise at least one connectivity port. In some embodiments, the at least one connectivity port comprises a Power over Ethernet (PoE) port.

In some embodiments, the universal dock connector comprises an M.2 connector.

In some embodiments, the dock is configured for outdoor installation.

In some embodiments, the first heat sink assembly comprises a first set of heat-dissipating fins, and the second heat sink assembly comprises a second set of heat dissipating fins. In some embodiments, the FWA device further comprises an o-ring to effectuate the environmental seal resulting in an Ingress Protection Code (IPC) 67 degree of protection, the o-ring preventing ingress of environmental debris between the first and second heat sink assemblies.

In some embodiments, the FWA device further comprises an o-ring sealing a connection between the radio module and the dock.

In some embodiments, the dock comprises a pressure escape valve.

In some embodiments, the second heat sink assembly is connectable to an adjustable outdoor mounting bracket.

In some embodiments, the adjustable outdoor mounting bracket comprises a first mounting plate operatively connectable to a first surface of the second heat sink assembly opposite a second surface of the second heat sink assembly to which the first heat sink assembly operatively connects.

In some embodiments, the adjustable outdoor mounting bracket comprises a second mounting plate operatively connectable to a mounting surface.

In accordance with one embodiment, a radio module comprises wireless communication circuitry, and a universal dock connector providing connectivity between the radio module and a plurality of docks, the plurality of docks comprising indoor installation docks and outdoor installation docks. The radio module may further comprise an interior heat sink assembly that is connectable to an external heat sink assembly of the outdoor installation docks to create an environmental seal therebetween, and is connectable to a cover such that when the radio module is docked to the indoor installation docks, a gap between the cover and the interior heat sink assembly allow for air ventilation through the radio module.

In some embodiments, the radio module further comprises a radome integrated into or attachable to a housing of the radio module.

In some embodiments, the wireless communication circuitry comprises a 5G modem.

In some embodiments, the universal dock connector comprises an M.2 connector.

In some embodiments, the interior heat sink assembly comprises a first set of heat-dissipating fins, and the external heat sink assembly comprises a second set of heat dissipating fins.

In accordance with one embodiment, a docking station comprises: a universal radio module connector adapted to connect to a corresponding docking station connector of a radio module; at least one connectivity port adapted to operatively connect to the radio module via the universal dock connector, providing data transmission and reception between the wireless communication circuitry and an associated communications device; and a first heat sink assembly operatively connecting to a second heat sink assembly of the radio module creating an environmental seal therebetween.

In some embodiments, the first heat sink assembly comprises a first set of heat-dissipating fins, and the second heat sink assembly comprises a second set of heat dissipating fins.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

Figure 1:
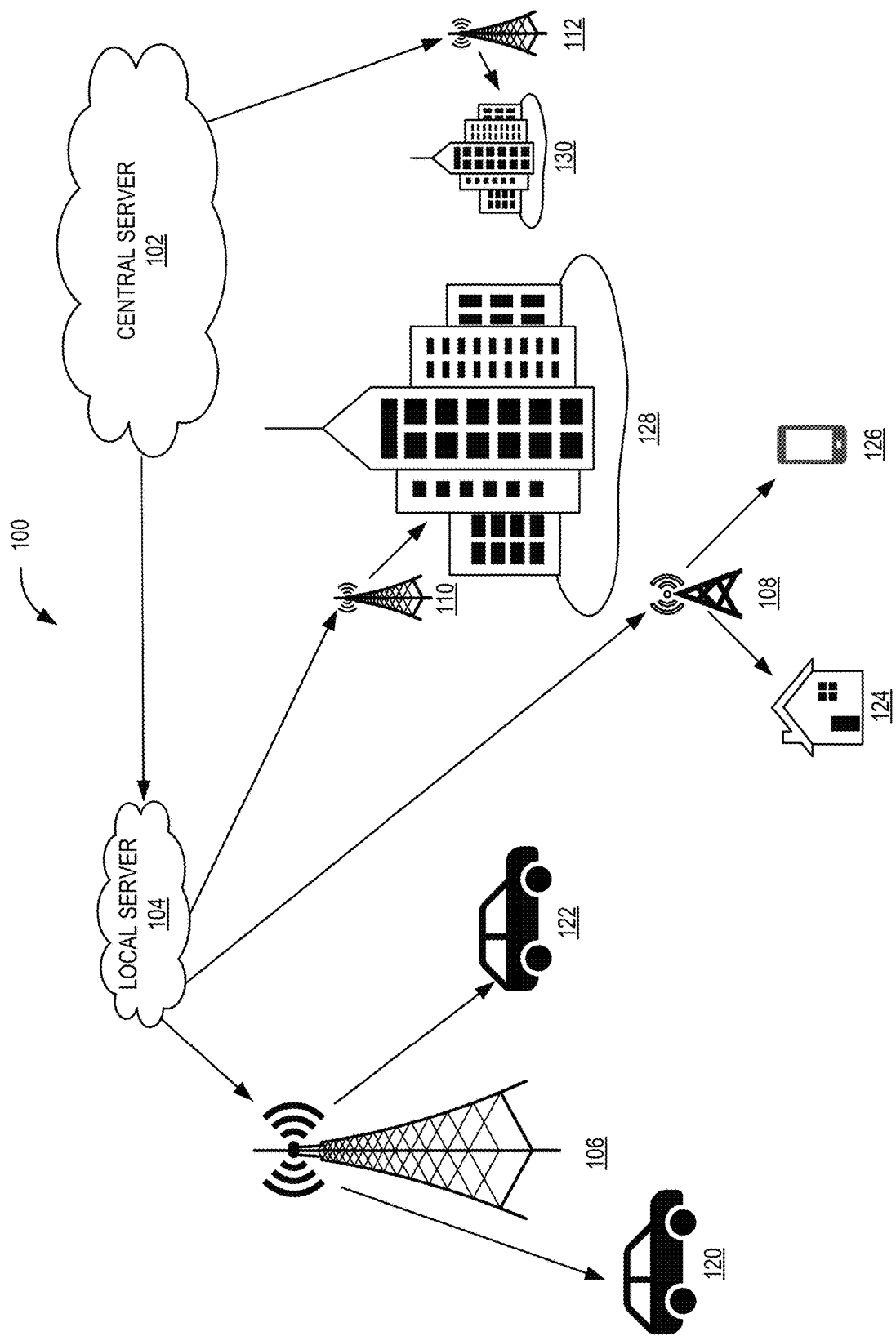
FIG. 1 illustrates an example 5G network with which various embodiments of the present disclosure may be implemented.

The figures are not exhaustive and do not limit the disclosure or the disclosed embodiments to the precise form disclosed.

DETAILED DESCRIPTION OF THE EMBODIMENTS

As alluded to above, 5G technology promises faster data speeds and lower latency. For example, with the promise of data speeds on the order of gigabytes, despite being a "mobile" standard, 5G technology can offer the possibility of providing, e.g., home broadband services over cellular networks. Fixed Wireless Access (FWA) can refer to a method or process of accessing a communications network or internet via fixed wireless networks. Accordingly, FWA can be used to realize 5G home broadband service over cellular networks. For example, FWA may involve the use of a cellular wireless system (3G, 4G, 5G, etc.) to provide broadband data ("internet"), voice, and/or other services to a particular area or location.

FWA may be thought of as a type of wireless broadband data communication that is effectuated between two fixed locations that are connected by FWA devices and/or equipment. FWA may be useful in areas where implementing wired broadband access (laying cable/wire) is prohibitively expensive, impractical, etc. especially in densely populated areas. In areas were wired broadband access already exists and/or would be cheap to implement, FWA may still be used to support software-defined networking in a wide area network (SD-WAN) with traffic bursting, as a backup to existing networks, etc. For example, customer premise equipment (CPE) is placed in a location and positioned to achieve cellular reception. The CPE then extends the services that the cellular network provides to that location, often translating it to one or more wireless or wired technology or protocols, as appropriate, for consumption by user equipment (UE).

5G FWA devices may have varying installation requirements/needs depending on certain factors, including but not necessarily limited to: physical location; line of sight (LOS) to a nearest base station, tower, etc., such as a next generation Node B (GnB); barriers and obstructions between a GnB and a 5G FWA (or radio/antenna thereof); indoor or outdoor use; high power versus standard power 5G FWA devices; and connectivity between a 5G FWA device and an in-home local area network (LAN). For example, the frequency of mmWave signals are so high that they cannot penetrate most building materials, e.g., cement or brick, or is attenuated/reflected so much that its utility is lost (e.g., on the order of above 20-50 dB). Even propagation through air results in signal loss, thereby limiting the efficacy of mmWave to smaller areas as alluded to above. Moreover, mmWave signals have poor multipath propagation. Factors that may compound these issues include, for example, a common desire by end users to place equipment wherever they desire (for convenience, aesthetics, etc.).

Accordingly, various embodiments of the present disclosure are directed to a modular FWA radio dock system that allows docking of a single radio module that can be installed in multiple, different locations by connecting to any one of a plurality of docks and/or communication accessories.

In this way, an end-user (and not necessarily a professional installer) has the ability to install/use radio modules in various locations as necessary/desired. As alluded to above, for example, in the 5G/mmWave context, placement of an FWA device to achieve line of sight to the nearest base station (GnB) to avoid transmission barriers/obstacles, etc. can be critical to achieving connectivity. From a vendor perspective, savings with inventory management costs can be realized by supporting a modular system. Further still, regulatory and/or industry certifications for the radio module can be acquired independently of the docking stations/accessories with which it may connect, leading to decreased manufacturing time and/or cost savings.

In some embodiments, the radio module can be paired with different types/configurations of docking stations that include, e.g., Wifi/Ethernet/PoE connectivity ports that provide connectivity to a local network, a wired/wireless router, or other networking equipment. In some embodiments, the docking stations may themselves include or have integrated therein, the router or networking functionality. In some embodiments, the docking stations can comprise both indoor and outdoor docking stations usable with the same radio module.

In some embodiments, an internal heat sink is integrated into the radio module, where the internal heat sink can be operatively connected to an external heat sink that forms a tight seal and enhances conductive heat transfer. In some embodiments, the external heat sink may include bolt-on connectivity to a mounting bracket for outdoor use.

In some embodiments, an outdoor docking station/accessory may provide environmental sealing, e.g., IP-67 compliant sealing, along with pressure relief mechanism(s).

In some embodiments an indoor docking station/accessory may include a silent, high-performance fan that blows air "up and through" the body of the radio module/between the body of the radio module and an outer housing.

Before describing example embodiments in detail, it is useful to describe an example environment with which various embodiments may be implemented. FIG. 1 illustrates an example 5G network 100 in which or with which various embodiments of the present disclosure may be implemented. 5G is a standard promulgated by the International Telecommunication Union (ITU) and the 3$^{rd}$ Generation Partnership Project (3GPP), with the ITU setting the minimum requirements for 5G compliance, and the 3GPP creating the corresponding specifications. 5G is a successor to the 4G/Long Term Evolution (LTE) standard, and refers to the fifth generation of wireless broadband technology for digital cellular networks. 5G is intended to replace or augment 4G/LTE. Touted advantages of 5G include, for example, up to 10 times faster download and upload speeds, along with much-reduced latency (also referred to as "air latency," i.e., the roundtrip time it takes for a device to communicate with the network).

The frequency spectrum of 5G includes three bands. The first band can be referred to as the low-band spectrum, i.e., the sub-1 GHz spectrum. This low-band spectrum is the primary band used by U.S. wireless carriers with data speeds reaching about 100 Mbps. The second band can be referred to as the mid-band spectrum, i.e., the sub-6 GHz spectrum, which provides lower latency (e.g., 4-5 ms) and greater data speeds (e.g., up to 1 Gbps) relative to the low-band spectrum. However, mid-band signals are not able to penetrate structures, such as buildings, as effectively as low-band signals. The third band can be referred to as the high-band spectrum, or millimeter wave (mmWave), and operates between 25 GHz and 100 GHz. The term millimeter is associated with this high-band spectrum because wavelengths in this portion of the spectrum range from, e.g., 1-10 mm. Devices operating on this third band can deliver the highest data speed (e.g., up to 10 Gbps) and the lowest latency (e.g., 1 ms). However, its coverage area (the distance it can transfer data) is less than that of the low-band and mid-band spectrums, and building penetration decreases as the frequency increases. Use of mmWave technology is nevertheless desirable because the low-band and mid-band portions of the spectrum are already heavily congested with, e.g., TV and radio signals, as well as 4G/LTE traffic, and so long as the coverage area can be limited, the benefits of mmWave technology can still be realized.

With reference now to FIG. 1, a mobile network's RAN may include various infrastructure, e.g., base stations/cell towers, masts, in-home/in-building infrastructure, and the like. The RAN allows users of mobile devices, e.g., smartphones, tablet computers, laptops, vehicle-implemented communication devices (e.g., vehicles having vehicle-to-vehicle (V2V) capabilities), to the core network. The example of FIG. 1 illustrates a plurality of 5G small base stations or small cells and 5G macro base stations or macro cells, i.e., 5G macro cells 106, 110, and 112, and 5G small cell 108.

Macro cells can refer to (tall, high-powered) "macro" base stations/cell towers that are able to maintain network signal strength across long/large distances. 5G macro cells may use multiple input, multiple output (MIMO) antennas that may have various components that allow data to be sent and/or received simultaneously. In the example 5G network 100 of FIG. 1, 5G macro cell 106 may provide wireless broadband coverage/communications to vehicles 120 and 122. 5G macro cell 110 may provide broadband service to an area, such as a city or municipality 128. Likewise, 5G macro cell 112 may provide broadband coverage to an area, such as a city or municipality 130. The MIMO antennas used by 5G macro cells may comprise large numbers of antenna elements, which can be referred to as massive MIMO, whose size may be comparable to, e.g., 3G and/or 4G base station antennas.

5G small cells can refer to wireless transmitters/receivers implemented as micro base stations designed to provide coverage to areas smaller than those afforded coverage by 5G macro cells, e.g., on the order of about 100 m to 200 m for outdoor 5G small cells. Indoor 5G small cell deployments may be on the order about 10 m. 5G small cells can be mounted or integrated into/onto street lights, utility poles, buildings, etc., and like 5G macro cells, may also leverage massive MIMO antennas. In the example 5G network 100 of FIG. 1, 5G small cell 108 provides broadband coverage to a house 124 and smartphone 126.

The core network may comprise the mobile exchange and data network used to manage the connections made to/from/via the RAN. As illustrated in FIG. 1, the core network of 5G network 100 may include central server 102 and local server 104. Central server 102 is shown to effectuate broadband service to municipality 130 by way of 5G macro cell 112. Central server 102 may also operatively connect to local server 104, which in turn, provides broadband connectivity by way of 5G macro cells 106 and 110, as well as 5G small cell 108. The use of distributed servers, such as local server 104 can improve response times, thereby reducing latency. The core network may leverage network function virtualization (instantiation of network functions using virtual machines via the cloud rather than hardware) and network slicing (segmentation of 5G network 100 in accordance with a particular application, industry, or other criteria) to provide these lower response times, and provide faster connectivity.

Figure 2:
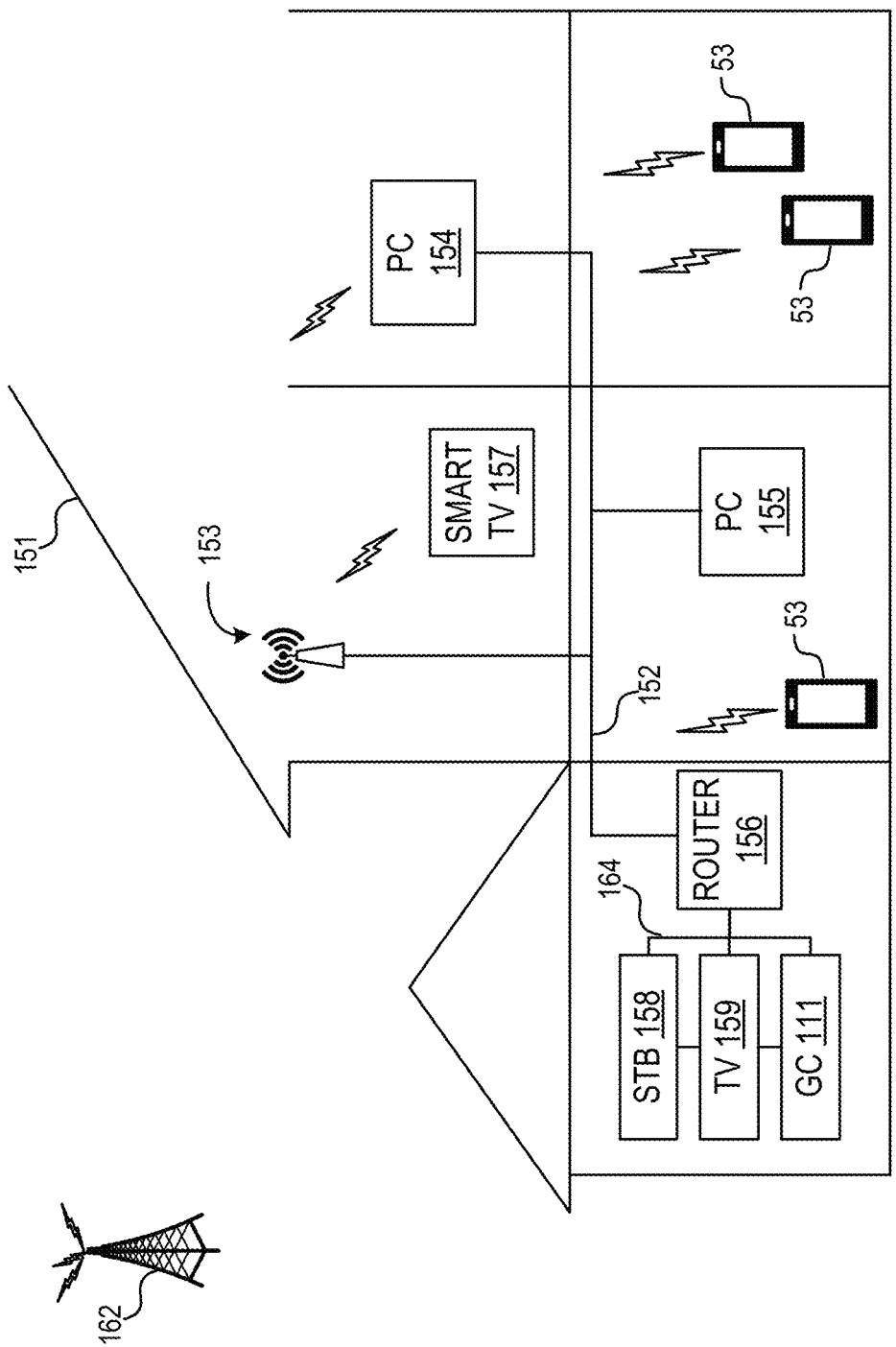
FIG. 2 illustrates an example of an in-home wireless and wired network with which various embodiments may be implemented.

FIG. 2 illustrates an example of an in-home wireless and wired network with which various embodiments may be implemented. The example of FIG. 2 shows a wired and wireless network operating within a building 151 (e.g., house 124 or a building in municipality 128 or municipality 130). Building 151 may include a house, and apartment, an office suite or building, a warehouse, a retail establishment or other commercial, residential or government building.

This example includes a wired network implemented using a wired communications medium 152. In some embodiments, the wired communications medium might be a fiber optic cable system, an Ethernet cable system, a coaxial cable system, a power line system, or other physical communications medium. A wireless access point 153 Is included in this example to provide a wireless network over which various devices within the building 151 may communicate wirelessly. For example, wireless access point 153 can function as a Wi-Fi router to create a Wi-Fi network over which the various devices can communicate. Wireless access point 153 may also include functionality to communicate with an external network such as, for example, through a 4G or 5G base station 162 (e.g., a macro cell or small cell). In this example, wireless access point 153 also includes a router so that it can communicate over wired communications medium 152.

This example also illustrates a number of devices that can communicate wirelessly or over wired communications medium 152 as devices on the network. This example includes a number of smart phones 53, a smart TV 157 and a personal computer (PC) 154 that can communicate wirelessly with wireless access point 153. This example also illustrates PC 154, a PC 155 and a router 156 that can communicate with wireless access point 153 via wired communications medium 152. Router 156 can further communicate with a set-top box 158, a television 159 and a gaming console 111 via a wired communications interface 164.

In some implementations, wireless access point 153 may be implemented as a Wi-Fi router for communications with devices within or within proximity of the outside of building 151. Wireless access point 153 may also include a modem such as a 5G modem to communicate with the Internet or other third parties via the 5G communication network. In this manner, the devices in communication with the Wi-Fi or ethernet router of wireless access point 153 may be connected to the Internet or other third parties.

Although various embodiments may be described in terms of this example environment, the technology disclosed herein can be implemented in any of a number of different environments.

Figure 3:
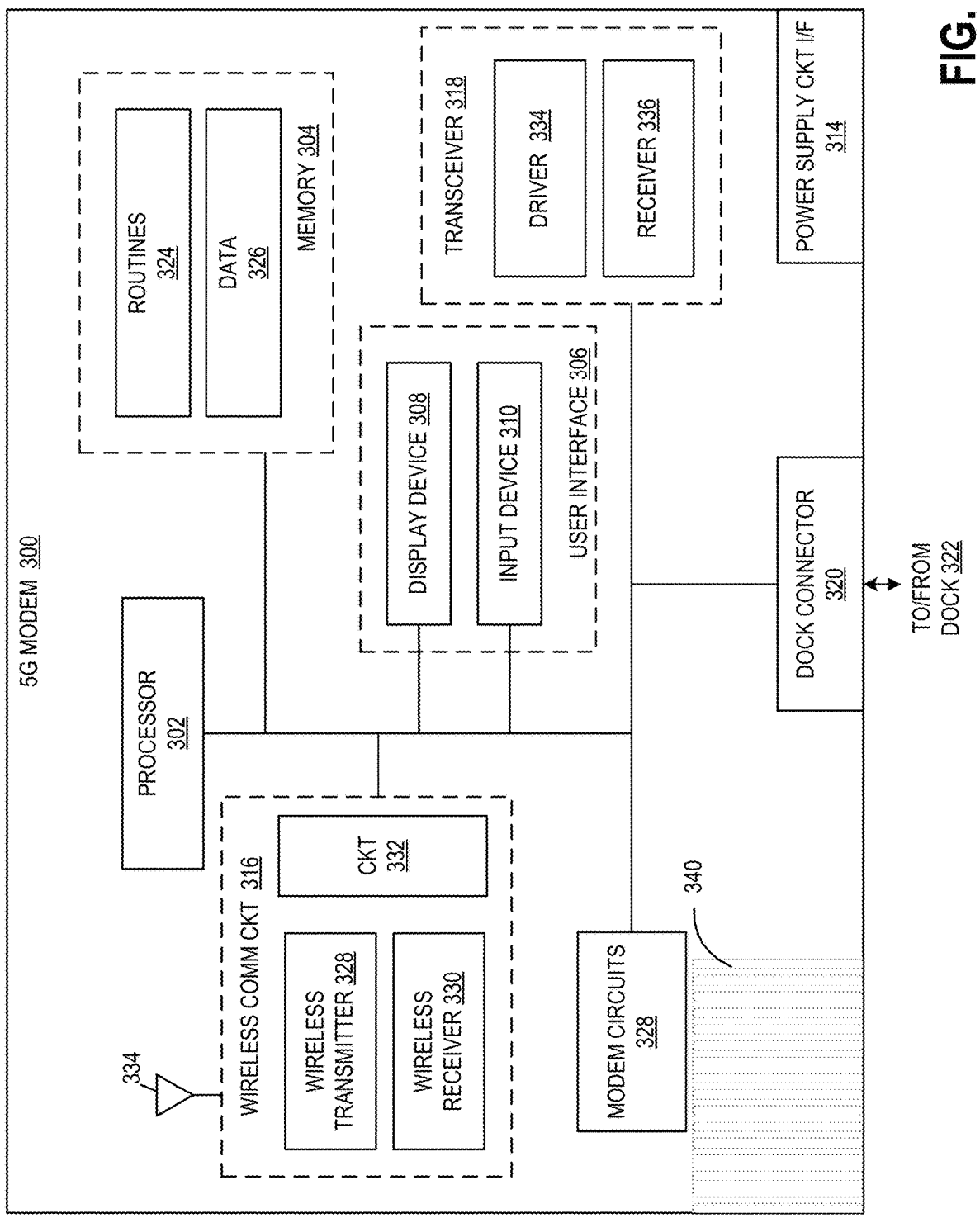
FIG. 3 is a block diagram of an example 5G radio module in accordance with one embodiment.

FIG. 3 is a schematic representation an example radio module, e.g., a 5G modem 300. 5G modem 300 may include a processor 302, a memory 304, user interface(s) 306 which may be in the form of a display device 308 and an input device 310, modem circuits 312, power supply circuit(s) 314, a 5G wireless communication circuit 316 a transceiver 318, and a dock connector 320.

Processor 302 may be implemented as a dedicated or general-purpose processor or combination of processors or computing devices to carry out instructions and process data. For example, processor 302 may access memory 304 to carry out instructions, including routines 326, using data including data 326. Processor 302 may include one or more single core, dual core, quad core or other multi-core processors. Processor 302 may be implemented using any processor or logic device, such as a complex instruction set computer (CISC) microprocessor, a reduced instruction set computing (RISC) microprocessor, a very long instruction word (VLIW) microprocessor, a processor implementing a combination of instruction sets, or other processing device. Other modem circuits 328 may be provided to perform other modem functions.

Memory 304 includes memory locations for storing instructions or other routines 324 and data 326. Memory 304 may be implemented using any machine-readable or computer-readable media to store data and instructions, including volatile and nonvolatile memory. Memory 304 may be implemented, for example, as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory or other solid state memory, polymer memory, ferroelectric memory, silicon-oxide-nitride-oxide-silicon (SONOS) memory, holographic or other optical storage, or other memory structures. Although memory 304 is illustrated as a separate component in FIG. 3, part or all of memory 304 can be implemented on the same integrated circuit as processor 302 or otherwise form part of all of embedded memory of processor 302.

Wireless communication circuit 316 may include a wireless transmitter 328, a wireless receiver 330, communication circuitry 332 and antenna 334 (to effectuate communications between 5G modem 300 and a serving GnB(s). Communication circuitry 332 may be implemented as a communications processor using any suitable processor logic device to provide appropriate communications operations such as, for example, baseband processing, modulation and demodulation, and other wireless communication operations. Where certain operations such as modulation and demodulation are performed in the digital domain, analog-to-digital and digital-to-analog conversion circuitry can be included to provide the appropriate interfaces between communication circuitry 332 and wireless transmitter 328/wireless receiver 330.

Transceiver 318 may be included to provide a hardwired communications interface between 5G modem 300 and dock 322 (which as will be described below) can be used to provide connectivity to a networking element, e.g., a Wi-Fi router connected to dock 322, and Ethernet router connected to dock 322. As noted above, dock 322 may have networking functionality integrated therein, e.g., dock 322 may be a Wi-Fi router, an Ethernet router, etc. The illustrated example includes a driver circuit 334 to transmit data to dock and a receiver circuit for 336 to receive data from dock 322 or one or more network elements operatively connected to dock 322. Using transceiver 318, data received from the 5G network intended for devices served by, e.g., a Wi-Fi router, can be transferred from 5G modem 300 to that Wi-Fi router. Similarly, transceiver 318 can receive data from devices served by the Wi-Fi router, and provide that data to other components of 5G modem 300 for processing and transmission to the 5G network.

The user interface 306 in this example may include a display device 308 and an input device 310. Display device 308 may include, for example, one or more LEDs, display screens, touch screens, or other alphanumeric displays, or other display devices to communicate data or other information to a user. Input device 310 may include buttons, a keypad, a touchscreen display, or other input device to accept input from a user. Display device 308 and input device 310 may include attendant circuitry such as drivers, receivers and processing or control circuitry to enable operation of the devices with 5G modem 300.

Although illustrated as part of 5G modem 300, user interface 306 may be implemented as part of dock 322. User interface 306 can provide a user interface to control operation of the entire modem/dock unit (and/or any networking elements or devices connected to dock 322), rather than just 5G modem 300. It should be noted that user interface 306 is optional, and 5G modem 300 need not have a user interface. A user of 5G modem 300 may interact, e.g., control or configure 5G modem 300 via a computing device operatively connected to 5G model 300 through wireless communications circuit 316. For example, user interface 306 may also be implemented using a separate device such as an application running on a smart phone, tablet, or other computing system. Accordingly, user interface 306 may include a wired or wireless communication interface to communicate with the smart phone, tablet or computing system running the application.

Power supply circuit(s) interface (I/F) 314 can be included to receive power provided from an external power source such as, for example, an AC mains circuit of the building or power over Ethernet (PoE) through Ethernet cabling vis-à-vis dock 322.

Moreover, 5G modem 300 may include a heat sink 340 internally integrated therein. It should be understood that the example heat sink 340 as illustrated is not necessarily representative of size/placement in 5G modem 300. That is, heat sink 340 may be larger, e.g., to cover, surround, or abut one or more heat-generating elements of 5G modem 300, e.g., wireless communications circuit 316, processor 302, power supply 314, etc. In some embodiments, multiple heat sinks may be utilized (not shown) to dissipate heat from heat-generating elements of 5G modem 300. In some embodiments, heat sink 340 may be sized and placed proximate to/atop the entirety of the elements/components of 5G modem 300. As is understood by those of ordinary skill in the art, a heat sink, such as heat sink 340 increases heat flow away from a heat-generating element or device by increasing that element's surface area.

In some embodiments, heat sink 340 may comprise or operatively connected to a conductor (also referred to as a thermal interface material) made of heat conducting material(s), e.g., aluminum alloys, copper, and/or other material(s) known now or in the future. Such a conductor may be used to move heat from a heat-generating element away from the heat-generating element to protrusions, typically fins that make up heat sink 340. In this way, the heat can be dissipated to the surrounding air within 5g Modem 300. The fins may vary in terms of height, width, configuration, and/or separation between adjacent fins depending on the amount of cooling needed/desired in 5G modem 300. Heat sink 340 as currently illustrated comprises a passive heat sink, although in other embodiments, heat sink 340 may be implemented as an active heat sink with, e.g., an attached fan (not shown) to assist in heat dissipation, or a hybrid heat sink.

Dock connector 320 may be a data connector, allowing for the exchange of data between 5G modem 300 and dock 322 (or other network devices connected to dock 322). Dock connector 320 may be configured in accordance with variety of different standards, e.g., mini Serial AT Attachment (mSATA), M.2, etc. That is, dock connector 320 may comprise various conductors (ground(s)/active data line pairs/etc.). Dock connector 320 can be configured, physically, in different ways to accommodate desired connectability to dock 322. For example, dock connector 320 may be oriented vertically allowing 5G modem 300 to be placed atop dock 322 (FIG. 6). It should be understood that in some embodiments dock connector 320 is a universal dock connector, in that it may be used to connect to multiple docks, e.g., an indoor dock, an outdoor dock, an indoor/outdoor dock configured with specific functionality, e.g., Wi-Fi-specific dock, Ethernet-specific dock, and so on. However, due to the sensitivity of 5G communications with respect to placement/location of a radio module relative to GnB, the antenna connector(s) for 5G modem 300 may be oriented in different ways depending on the orientation of antennas, e.g., antenna 334, therein, which can be driven by antenna performance.

Figure 4:
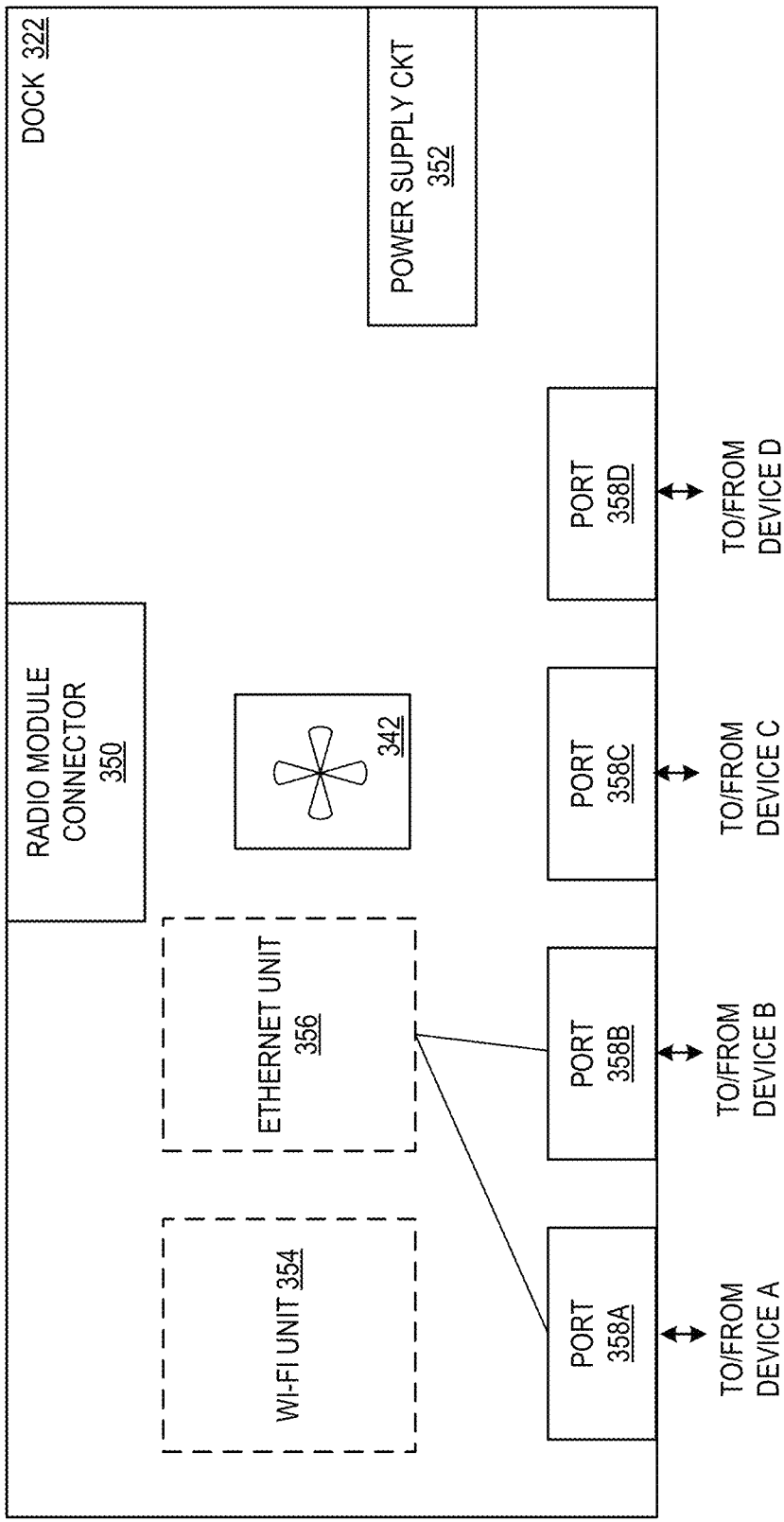
FIG. 4 is a block diagram of an example dock to which the 5G radio module of FIG. 3 may be connected in accordance with one embodiment.

FIG. 4 illustrates an example dock 322 that may be operatively connected to 5G modem 300 to provide indoor and/or outdoor mounting installations to a user. As illustrated in FIG. 4, dock 322 may include a radio module connector 350. Radio module connector 350 may be a corresponding slot configured to accept dock connector 320 of FIG. 3. That is, dock connector 320 may mate with radio module connector 350 to physically and operationally connect 5G modem 300 and dock 322.

Dock 322 may also comprise a power supply circuit(s) 352 to provide power conditioning or power conversion for components of 5G modem 300 as well as any components resident in dock 322, e.g., Wi-Fi unit 354 and Ethernet unit 356. For example, power supply circuit(s) 352 can supply power to different components of 5G modem 300 and dock 322 at specific voltage and current levels appropriate for those components. Power supply circuit(s) 352 in this example, may receive power from an external power source such as, for example, an AC mains circuit of the building or power over Ethernet (PoE) through Ethernet cabling.

In some embodiments, as alluded to above, dock 322 may have its own integrated networking functionality. Example of such networking functionality includes, e.g., Wi-Fi unit 354, which may be embodied as a Wi-Fi router. By virtue of its connection to 5G modem vis-à-vis dock 322, Wi-Fi unit 354 allows for the transmission/reception of data to/from the Internet or other data network on behalf of user devices (e.g., laptop computers, table computers, smartphones, etc.) through connectivity provided by 5G modem 300. It should be noted that Wi-Fi unit 354 is only an example, and other wireless routers, for example, may be implemented in dock 322 to provide wireless connectivity/data transfer.

Another example of such networking functionality includes, e.g., Ethernet unit 356, which may be embodied as an Ethernet hub or switch. By virtue of its connection to 5G modem vis-à-vis dock 322, Ethernet unit 356 allows for a wired connection between a device(s) and 5G modem 300. Such a device may be a separate Wi-Fi router (that effectuates wireless data communications between 5G modem 300 and user devices, or a wired computer, or other user/customer premise equipment.

Accordingly, dock 322 may further include one or more ports 358 to accommodate connections to dock 320/5G modem 300. One or more of ports 358 may be Ethernet LAN/RJ45 ports, Universal Serial Bus (USB) ports, WAN ports, etc. It should be noted that there may more or less ports that those illustrated in FIG. 4 to accommodate varying needs/desired dock configurations. For example, as will be described in greater detail below, an outdoor dock may have an integrated Wi-Fi unit, such as Wi-Fi unit 354, without any ports, as typically, users will want to connect wirelessly to an outdoor 5G modem installation. In some embodiments, dock 322 may be configured specifically to act only as a Wi-Fi router or only as an Ethernet hub, for example.

Dock 322 may further comprise a fan(s) 342 for further dissipating heat generated by the one or more heat-generating components or elements of 5G modem 300 and/or dock 322. For example, fan(s) 342 may be configured to intake air from outside the housing (not shown) of dock 322 and route it through dock 322 and through 5G modem 300 to provide cooling/heat dissipation. For example, a small envelope axial and/or blower fan(s) with DC brushless motors may be used.

Figure 5B:
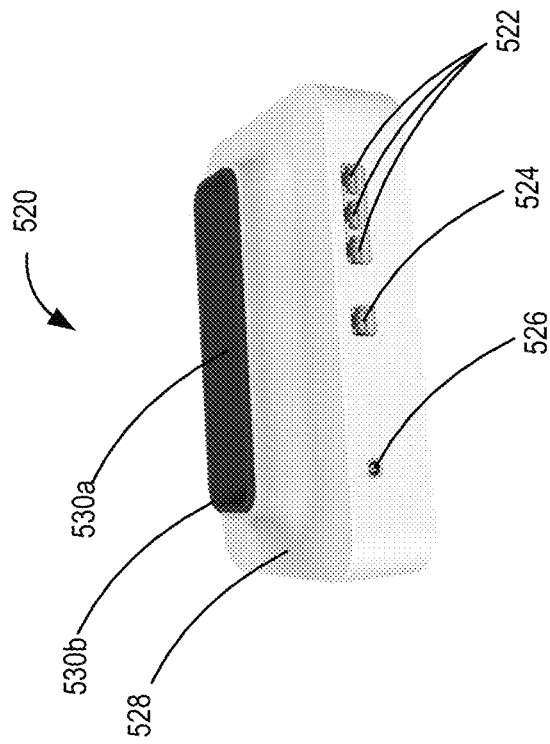
FIG. 5B illustrates an implementation of an example indoor radio module dock in accordance with another embodiment
Figure 5A:
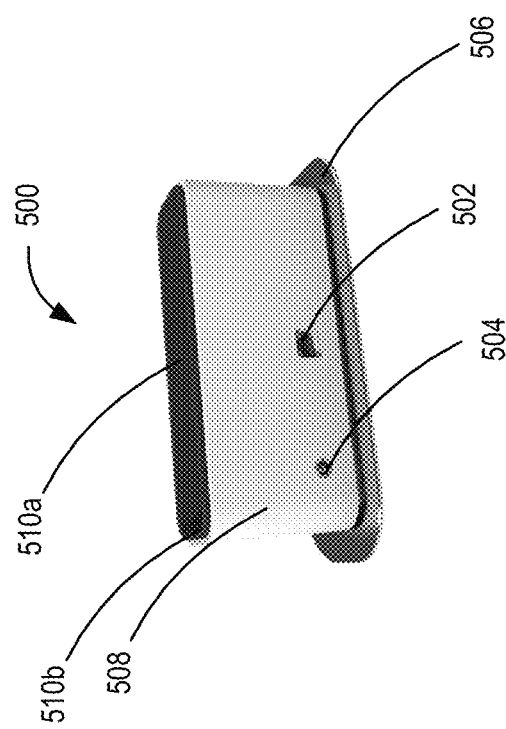
FIG. 5A illustrates an implementation of an example indoor radio module dock in accordance with one embodiment.

FIG. 5A illustrates an example implementation of an indoor radio module dock 500 in accordance with one embodiment. As illustrated, and as described above, dock 500 may comprise one or ports with which one or more user devices, networking devices, etc. may connect to a radio module or FWA device, such as 5G modem 300 (FIG. 3). In this embodiment, indoor radio module dock 500 may be configured as an Ethernet dock, and port 502 may be an Ethernet LAN port. To power a radio module, such as 5G modem 300, when connected to dock 500, dock 500 may be connected to a power supply such as building mains via a power port 504.

Dock 500 may further comprise a base 506, and a housing 508 encapsulating the inner components/elements of dock 500, e.g., a Wi-Fi unit (such as Wi-Fi unit 354, Ethernet unit 356, power supply circuit(s) 352, radio module connector 350, etc. Various materials may be used to construct one or more elements comprising dock 500 as would be understood by those of ordinary skill in the art. Considerations such as stability of dock 500 when connected to a radio module, heat containment/dissipation, etc. may be taken into account regarding an appropriate material(s) to be used to construct dock 500 and its components.

Dock 500 may further comprise a cavity or aperture 510*a* for receiving an securing a radio module therein. In the example embodiment of FIG. 5A, cavity 510*a* may be surrounded by a protruding lip/border 510*b*. Lip 510*b* may provide additional security/stability when a radio module is connected thereto by fitting into a corresponding border cavity on the radio module (554*c* of FIG. 6).

FIG. 5B illustrates an example implementation of an indoor radio module dock 520 in accordance with another embodiment. As illustrated, and as described above, dock 500 may comprise one or ports with which one or more user devices, networking devices, etc. may connect to a radio module or FWA device, such as 5G modem 300 (FIG. 3). In this embodiment, indoor radio module dock 520 may be configured as a Wi-Fi dock having multiple ports 522 which may be 1 Gbps ports, and port 524 which may be a 5 Gbps port. The number of such ports can vary in accordance with different embodiments.

To power a radio module, such as 5G modem 300, when connected to dock 520, dock 520 (similar to dock 500) may be connected to a power supply such as building mains via a power port 526.

Also like dock 500, dock 520 may further comprise a base/housing 528 encapsulating the inner components/elements of dock 520, e.g., a Wi-Fi unit (such as Wi-Fi unit 354, Ethernet unit 356, power supply circuit(s) 352, radio module connector 350, etc. Unlike dock 500, however, base/housing 528 may be integrated into a single/monolithic unit. Again, various materials may be used to construct one or more elements comprising dock 520 as would be understood by those of ordinary skill in the art.

Dock 520 may also comprise a cavity or aperture 530*a* for receiving and securing a radio module therein. In the example embodiment of FIG. 5B, cavity 530*a* may be surrounded by a protruding lip/border 530*b*. Lip 530*b* (like lip 510*b* of FIG. 5A) may provide additional security/stability when a radio module is connected thereto by fitting into a corresponding border cavity on the radio module (554*c* of FIG. 6).

Figure 6A:
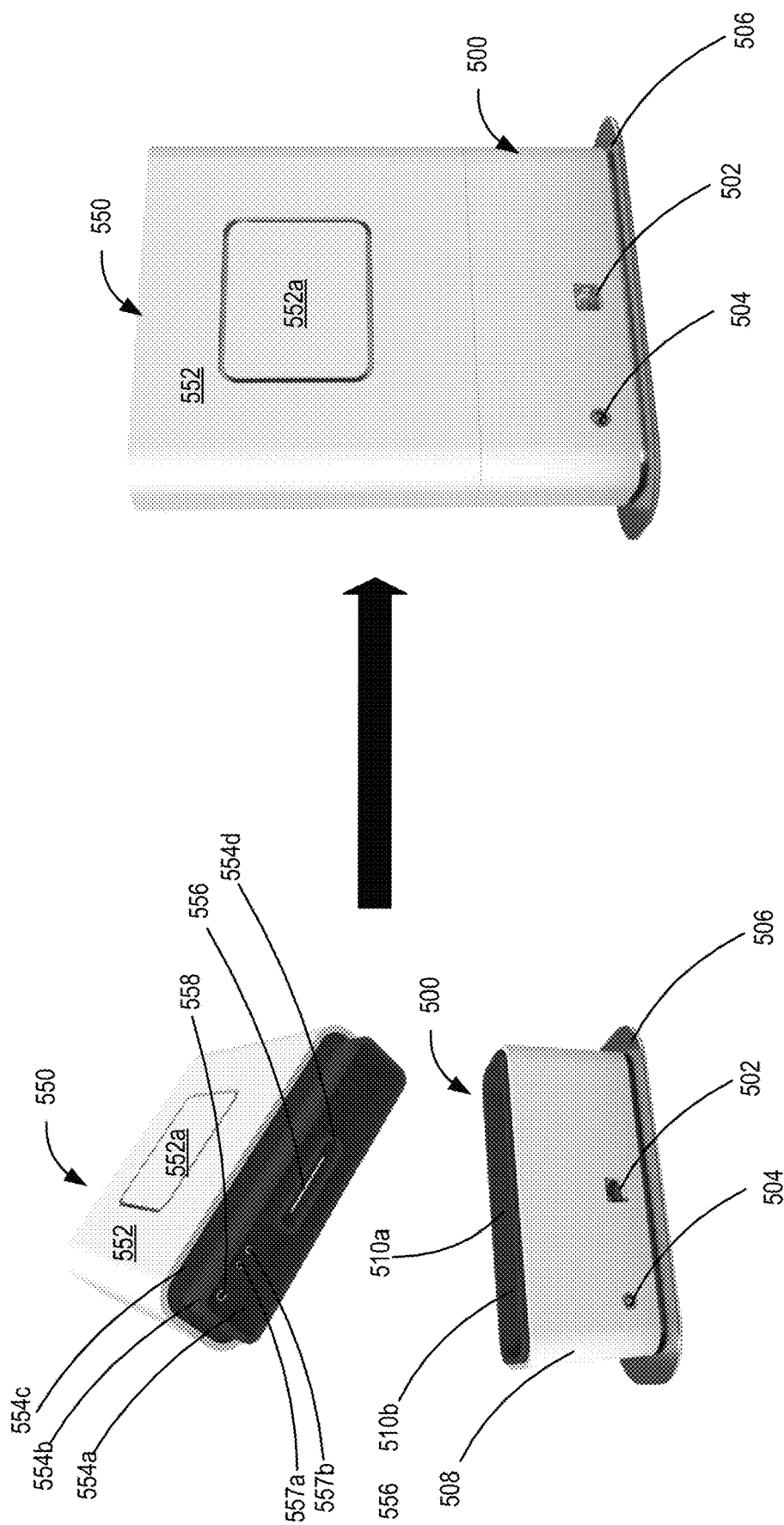
FIG. 6A illustrates an example modular fixed wireless access device in accordance with one embodiment.

FIG. 6A illustrates example dock 500 to which radio module 550 may operatively connect via dock connector 556 (which as described above may be an M.2 connector, a mSATA connector, etc. that mates with a corresponding slot in dock 500 (not shown). Also illustrated in FIG. 6A is a housing 552 encapsulating the elements/components of radio module 550 (which may be, e.g., a 5G modem, such as 5G modem 300). A portion of housing 552 may comprise a heat sink cover 552*a* that covers an internal heat sink of radio module 550 (e.g., heat sink 340) when used with an indoor dock, such as dock 500. It should be noted that in some embodiments, heat sink cover 552*a* may be made of a metallic material and/or may itself have integrated thereon, fins, to assist in heat dissipation.

Furthermore, radio module 550 comprises dock connector 556 to electronically connect radio module 550 to dock 500. As alluded to above, dock 500 may comprise a lip 510*b* that engages or fits within a border cavity 554*c*. Dock 500 may also comprise a protruding lip/border 554*b* (surrounding a cavity 554*a* in which dock connector 556 is positioned) to engage cavity 510*a* of dock 500. Further still, to protect dock connector 556, radio module 550 may include a protective lip/border 554*d* that extends/surrounds dock connector 556. Additionally, radio module 550 may further comprise a power, e.g., DC, connector 558 and two TS9 antenna connectors 557*a, b*. It should be noted that the orientations/placement of these connectors can vary, as can the number of connectors. For example, there may be less or more antenna connectors to accommodate the commensurate number of antennas in radio module 550.

When connected, radio module 550 rests atop dock 500 to create a single FWA device. If a user wishes to relocate radio module 550 (e.g., to achieve better reception/connection to a GnB), the user may remove radio module 550 and connect radio module 550 to another dock, e.g., dock 520. If a user wishes to connect radio module 550 to another dock that may have different functionality than that of dock 500, again, the user may simply remove radio module 550 and attach/connect radio module 550 to the desired dock. As will be described below, radio module 550 can be moved between indoor and outdoor installations simply by moving the same radio module 550 to alternative docks.

Figure 6C:
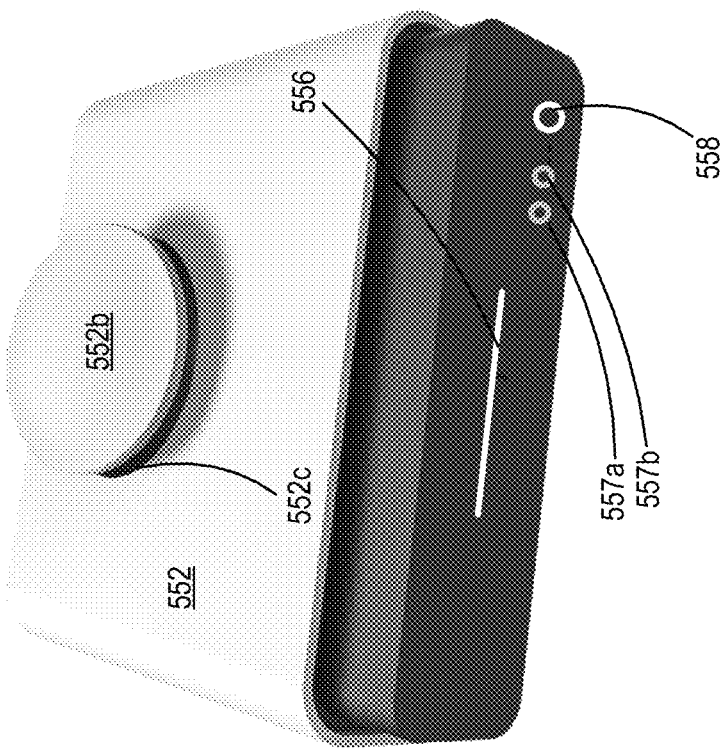
FIG. 6C illustrates an example radio module having a replaceable radome in accordance with another embodiment.
Figure 6B:
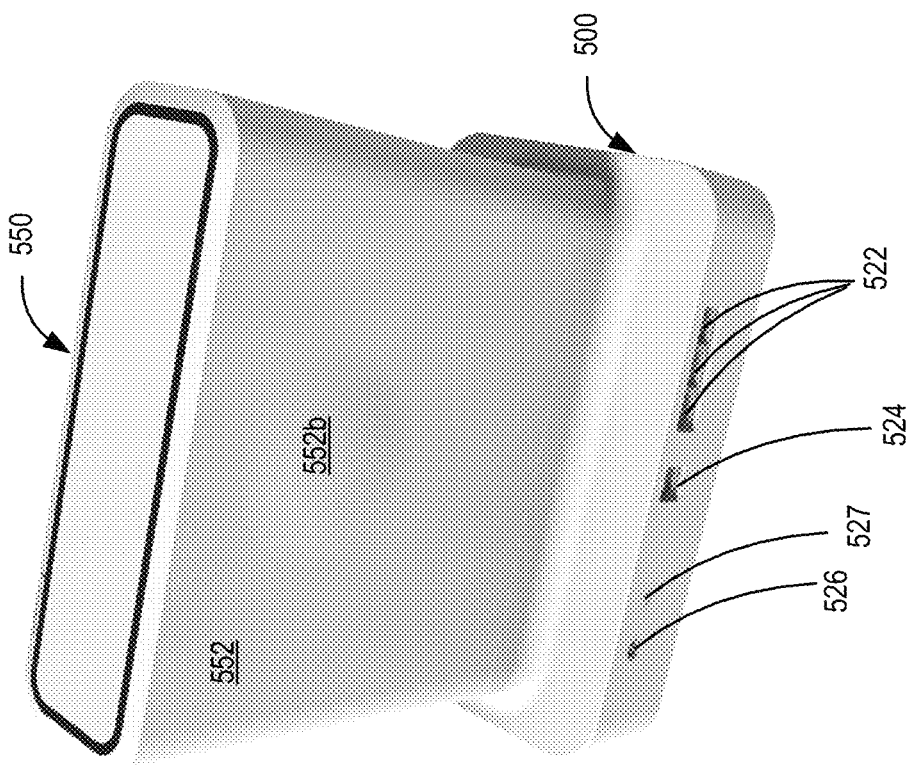
FIG. 6B illustrates an example modular fixed wireless access device in accordance with another embodiment.

FIG. 6B illustrates an example FWA device, where in this embodiment, radio module 550 includes a radome 552*b* on one surface of housing 552. Radome 552*b* may be configured to protect an antenna(s) of the FWA device (e.g., antenna 334). It should be understood that the location/positioning of radome 552*b* can vary, and more than one radome may be provided if warranted. As illustrated in FIG. 6B, radome is configured as being integral to housing 552. Also illustrated in FIGS. 6B (and 6D described below), is a power on/off switch 527.

FIG. 6C illustrates another embodiment of radio module 550 that may include a replaceable radome 552*b*. In this embodiment, radome 552*b* can be replaced/swapped for other radome configurations that can depend on the characteristics of radio module 550. For example, different radomes can be used for different radios, e.g., mmWave, radios. The different radio modules can have different power levels, different numbers of radios, etc. Referring back to FIG. 3, an mmWave radio may be embodied by 5G wireless communication circuit 316. In this embodiment, an o-ring or other seal/sealing mechanism 552*c* may be placed between radome 552*b* and an outer surface of housing 552.

Figure 6E:
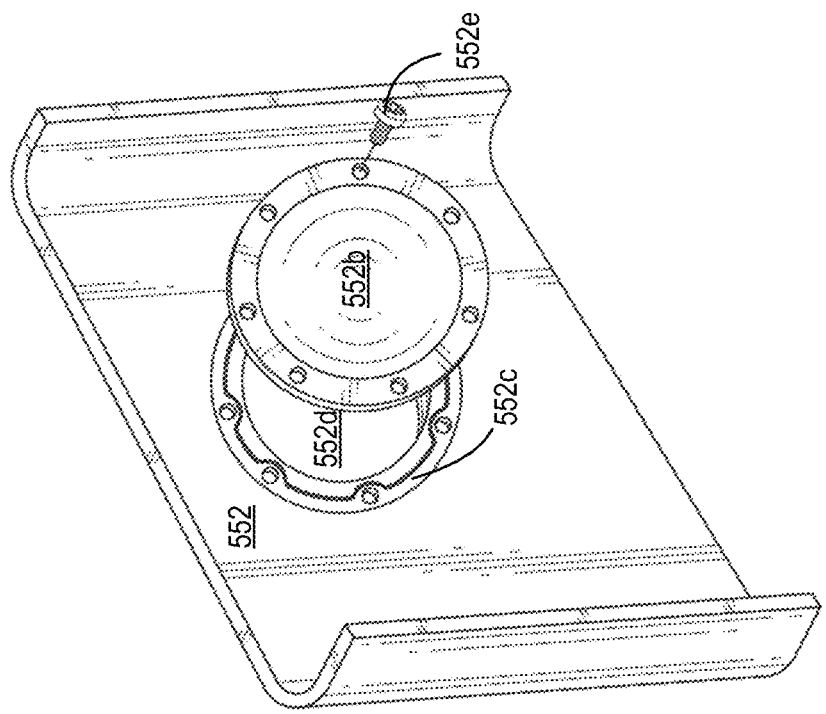
FIG. 6E is a rear cutaway view of a housing of an example radio module with a replaceable radome in accordance with yet another embodiment.
Figure 6D:
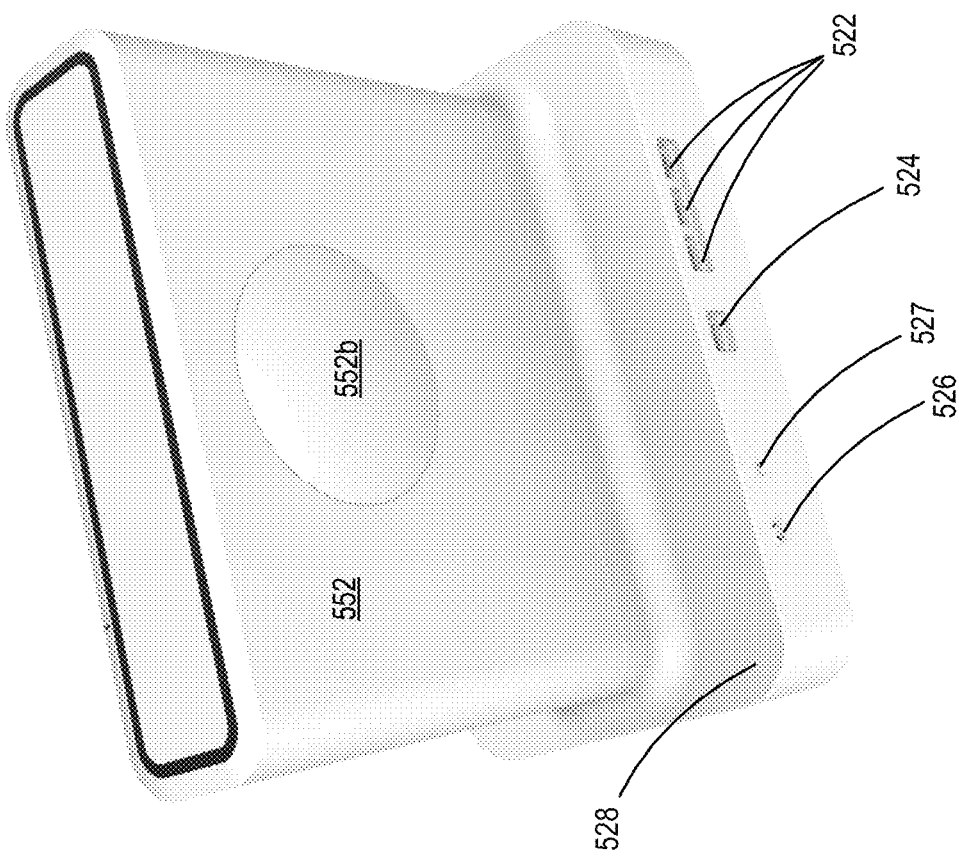
FIG. 6D illustrates an example radio module having a replaceable radome in accordance with yet another embodiment.

FIGS. 6D and 6E illustrate an outside, perspective view and an inner-housing, perspective view, respectively, of yet another embodiment of a replaceable radome, where radome 552*b* may be removed/replaced from the rear or inner surface of housing 552. As illustrated in FIG. 6E, housing 552 may include an aperture 552*d* for receiving radome 552*b*. An o-ring or other sealing mechanism, e.g., silicone bead, foam, or other sealing and conforming material, etc. may be placed between radome 552*b* and the perimeter of aperture 552*d* on the inner/read surface of housing 552. In some embodiments, as illustrated in FIG. 6D, radome 552*b* may be attached to housing 552 by one or more screws, one of which is labeled 552*e* for ease of reference, although other attachment methods/mechanisms may be used, e.g., non-permanent adhesive, to allow installation and replacement of radome 552*b*. It should be understood that in some embodiments, the appropriate radome (depending on the characteristics of radio module 550) can be installed during manufacture or assembly of radio module 550 providing further modularity.

Referring back to FIG. 3, and as described above, a dock, such as dock 500 may comprise a fan, e.g., fan 342. Despite fan 342 being located in dock 500, fan 342, can direct air flow (up and through) radio module 550 between housing 552 and the components/elements encapsulated by housing 552. In some embodiments, radio module may have one or more vents or airways, e.g., between housing 552 and heat sink cover 552*a* to facilitate the passage of air from fan 342. Likewise, dock 500 may have one or more vents (not shown) to provide a way for fan 342 to intake air.

As noted above, various configurations/orientations are possible in accordance with different embodiments. The "vertical" placement/orientation of radio module 550 atop dock 500 as illustrated in FIG. 6 is only one, non-limiting example contemplated in accordance with various embodiments.

Figures 7A, 7B:
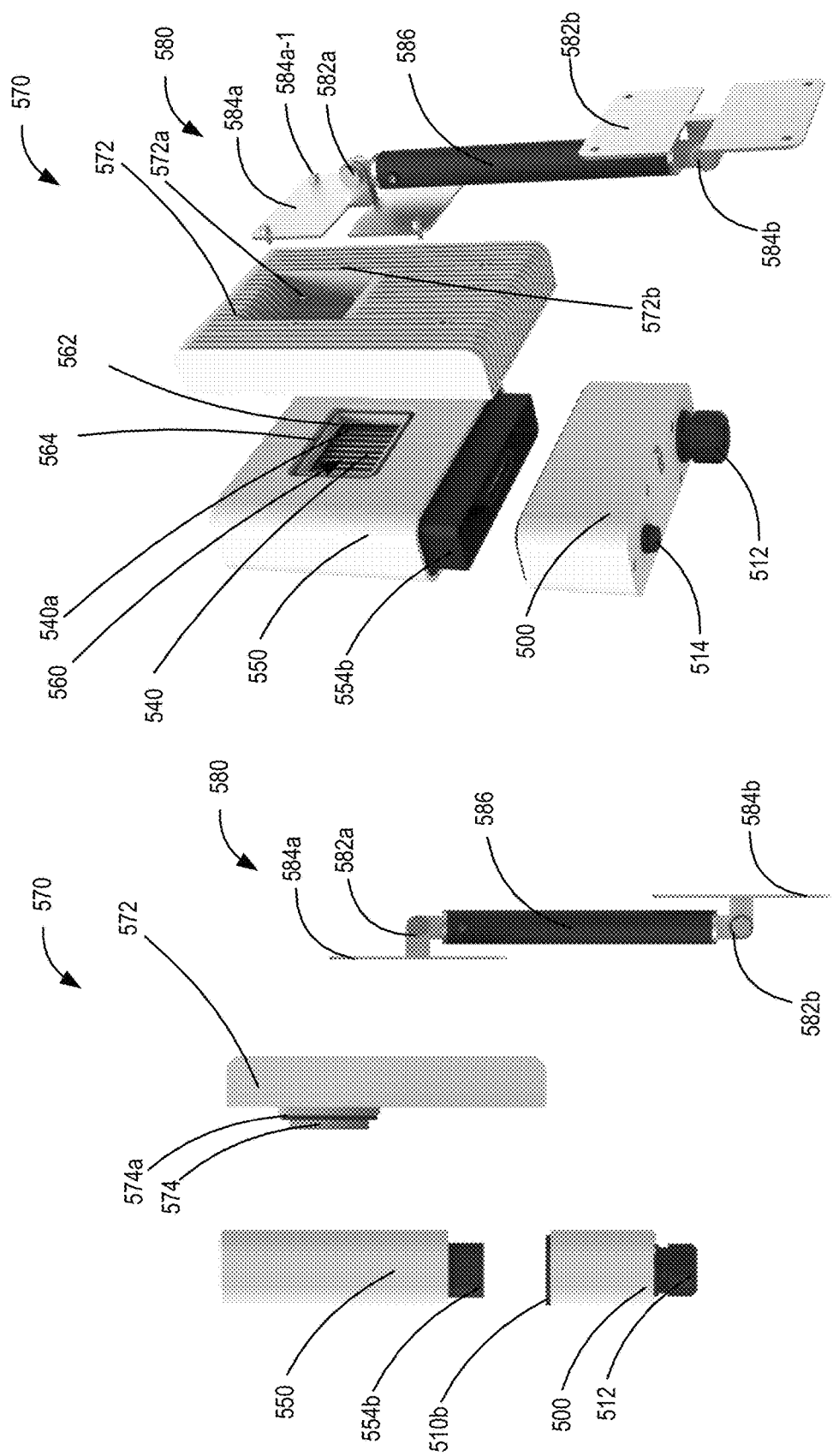
FIG. 7A illustrates a side view of an example radio module and outdoor radio module dock in accordance with one embodiment.
FIG. 7B illustrates a perspective view of the example radio module and outdoor radio module dock of FIG. 7A.

FIG. 7A is a side view of an example radio module, dock, and outdoor mounting assembly in accordance with one embodiment. FIG. 7B is a perspective view of the example radio module, dock, and outdoor mounting assembly of FIG. 7A, and will be discussed in conjunction with FIG. 7A.

Again, a single radio module, such as radio module 550, may be used between/amongst various docks to effectuate a modular FWA device. Here, dock 500 may comprise a PoE connector/port 512 to which an Ethernet cable may be connected to provide both Ethernet connectivity and power to radio module 550 via dock 500. A pressure equalization valve 514 may also be included. As will be described below, an outdoor installation may necessitate sealing to prevent the ingress of debris or other elements. Accordingly, some embodiments may result in a modular FWA device that is sealed from the outside environment such that pressure can build up therein when radio module 550 is connected to dock 500. For example, dock 500 may include a sealing member, such as an o-ring (not shown) encompassing or integrated into lip 510*b* to seal the connection between radio module 550 and dock 500.

Due to the outdoor nature of this embodiment, users may wish to mount such a modular FWA device on a building wall (or other outside structure/outer surface of a structure), e.g., to achieve optimal placement/orientation, as well as achieve a clean(er) installation. Accordingly, when radio module 550 is connected to dock 500 (as already described above), radio module 550 can be mounted to an outdoor mount assembly 570.

In some embodiments, outdoor mount assembly 570 may comprise an external heat sink 572, and a mounting bracket 580. External heat sink 570 may operatively compliment an internal heat sink 540 of radio module 550. As described above, a radio module, such as 5G modem 300 may include a heat sink 340. Internal heat sink 540 may be an embodiment of heat sink 340. The use of an external heat sink, such as external heat sink 572 provides additional heat dissipation. It should be understood that because radio module 550 will be exposed to environment, without the benefit of (interior) air conditioning, for example, excessive heat buildup may occur more readily in an outdoor installation. Moreover, added size/footprint due to an external heat sink may be more acceptable in an outdoor installation versus an indoor installation.

With the heat sink cover 552*a* removed, a cavity 560 is revealed which exposes at least a portion of heat sink 540 to which external heat sink 572 can be mated. Bordering or defining cavity 560 may be a border 562. Adjacent to that border 562 may be a channel 564. Cavity 560 can receive external heat sink mount 574, and a seal can be created by virtue of channel 564 receiving seal 574*a* (which may be, e.g., an o-ring made of rubber or silicone (or other appropriate material). In some embodiments, because cavity 540 may provide ingress for dust, debris, etc. from the outside environment, the seal may be configured to comply with various Ingress Protection Code (IPC) standards, e.g., an IP67 rating. It should be understood that this is a non-limiting example.

External heat sink 572 may in turn be mounted to bracket assembly 580. Bracket assembly 580 may comprise a first mounting plate 584*a* to which external heat sink 572 can be attached via one or more screws, bolts, or other attachment mechanisms. For example, epoxies, polyurethanes, polyimides, cyanoacrylate, and other glues or adhesives can be provided in various forms. These can include pastes, liquids, films, sprays, pellets, tapes, PSAs, and so on. They can be provided in different types including hot melt, reactive hot melt, thermosetting, pressure sensitive, contact adhesives, and so on. In the example of FIGS. 7A and 7B, the illustrated attachment mechanism is a screw, one of which is labeled as screw 584*a*-1. Screw 584*a*-1 may be received by screw holes, e.g., screw hole 572*b* of external heat sink 572, in accordance with one embodiment. Bracket assembly 580 may have a second mounting plate 584*b* to allow mounting to a surface, such as a building wall, or other structure. First and second mounting plates 584*a* and 584*b* may be pivotally attached to a bracket assembly arm 586 via corresponding hinges 582*a* and 582*b*, allowing the mounting plates 584*a* and 584*b* to each be adjusted, e.g., angled, to fit or comply with a desired installation position. Although hinges 582*a* and 582*b* are illustrated in FIG. 7B as being adjustable in only one axis of movement, other embodiments contemplate hinges/mechanisms that can provide adjustment in still other directions.

In some embodiments, external heat sink 572 may be mated to internal heat sink 540 by way of bolts or screws, one example of which is screw 572 which can mate with screw hole 540*a*. It should be noted that this manner of mounting/mating external heat sink 572 to internal heat sink 540 is only one, non-limiting example. Other methods/mechanisms of mounting or mating external heat sink 572 to internal heat sink 540 known to those of ordinary skill in the art (currently or in the future) may be utilized.

The terms "substantially" and "about" used throughout this disclosure, including the claims, are used to describe and account for small fluctuations, such as due to variations in processing. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

The term "coupled" refers to direct or indirect joining, connecting, fastening, contacting or linking, and may refer to various forms of coupling such as physical, optical, electrical, fluidic, mechanical, chemical, magnetic, electromagnetic, optical, communicative or other coupling, or a combination of the foregoing. Where one form of coupling is specified, this does not imply that other forms of coupling are excluded. For example, one component physically coupled to another component may reference physical attachment of or contact between the two components (directly or indirectly), but does not exclude other forms of coupling between the components such as, for example, a communications link (e.g., an RF or optical link) also communicatively coupling the two components. Likewise, the various terms themselves are not intended to be mutually exclusive. For example, a fluidic coupling, magnetic coupling or a mechanical coupling, among others, may be a form of physical coupling.

Figure 8:
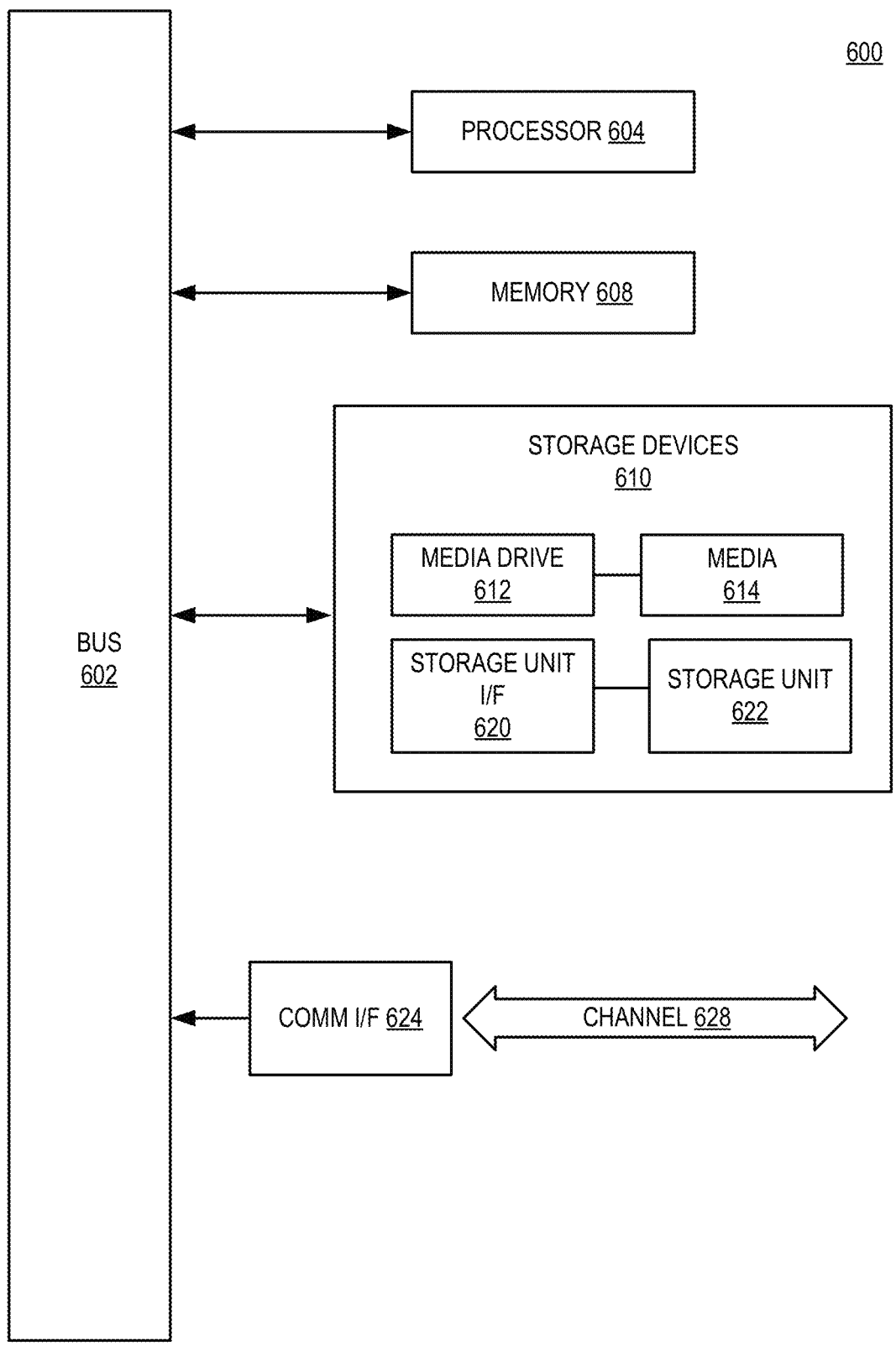
FIG. 8 illustrates an example of an example computing component that may be used in implementing various features of embodiments of the disclosed technology.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. In other words, as would be apparent to one of ordinary skill in the art after reading this description, the various features and functionality described herein may be implemented in any given application and can be implemented in one or more separate or shared circuits in various combinations and permutations. Even though various features or elements of functionality may be individually described or claimed as separate circuits, one of ordinary skill in the art will understand that these features and functionality can be shared among one or more common circuits, and such description shall not require or imply that separate circuits are required to implement such features or functionality.

Where circuits are implemented in whole or in part using software, in one embodiment, these software elements can be implemented to operate with a computing or processing system capable of carrying out the functionality described with respect thereto. One such example computing system is shown in FIG. 8. Various embodiments are described in terms of this example-computing system 600. After reading this description, it will become apparent to a person skilled in the relevant art how to implement the technology using other computing systems or architectures.

Referring now to FIG. 8, computing system 600 may represent, for example, computing or processing capabilities found within desktop, laptop and notebook computers; hand-held computing devices (smart phones, cell phones, palmtops, tablets, etc.); mainframes, supercomputers, workstations or servers; or any other type of special-purpose or general-purpose computing devices as may be desirable or appropriate for a given application or environment. Computing system 600 might also represent computing capabilities embedded within or otherwise available to a given device. For example, a computing system might be found in other electronic devices such as, for example, digital cameras, navigation systems, cellular telephones, portable computing devices, modems, routers, WAPs, terminals and other electronic devices that might include some form of processing capability.

Computing system 600 might include, for example, one or more processors, controllers, control modules, or other processing devices, such as a processor 604. Processor 604 might be implemented using a general-purpose or special-purpose processing engine such as, for example, a microprocessor (whether single-, dual- or multi-core processor), signal processor, graphics processor (e.g., GPU) controller, or other control logic. In the illustrated example, processor 604 is connected to a bus 602, although any communication medium can be used to facilitate interaction with other components of computing system 600 or to communicate externally.

Computing system 600 might also include one or more memory modules, simply referred to herein as main memory 608. For example, in some embodiments random access memory (RAM) or other dynamic memory, might be used for storing information and instructions to be executed by processor 604. Main memory 608 might also be used for storing temporary variables or other intermediate information during execution of instructions to be executed by processor 604. Computing system 600 might likewise include a read only memory ("ROM") or other static storage device coupled to bus 602 for storing static information and instructions for processor 604.

The computing system 600 might also include one or more various forms of information storage mechanism 610, which might include, for example, a media drive 612 and a storage unit interface 620. The media drive 612 might include a drive or other mechanism to support fixed or removable storage media 614. For example, a hard disk drive, a floppy disk drive, a magnetic tape drive, an optical disk drive, a CD or DVD drive (R or RW), a flash drive, or other removable or fixed media drive might be provided. Accordingly, storage media 614 might include, for example, a hard disk, a floppy disk, magnetic tape, cartridge, optical disk, a CD or DVD, or other fixed or removable medium that is read by, written to or accessed by media drive 612. As these examples illustrate, the storage media 614 can include a computer usable storage medium having stored therein computer software or data.

In alternative embodiments, information storage mechanism 610 might include other similar instrumentalities for allowing computer programs or other instructions or data to be loaded into computing system 600. Such instrumentalities might include, for example, a fixed or removable storage unit 622 and an interface 620. Examples of such storage units 622 and interfaces 620 can include a program cartridge and cartridge interface, a removable memory (for example, a flash memory or other removable memory module) and memory slot, a flash drive and associated slot (for example, a USB drive), a PCMCIA slot and card, and other fixed or removable storage units 622 and interfaces 620 that allow software and data to be transferred from the storage unit 622 to computing system 600.

Computing system 600 might also include a communications interface 624. Communications interface 624 might be used to allow software and data to be transferred between computing system 600 and external devices. Examples of communications interface 624 might include a modem or softmodem, a network interface (such as an Ethernet, network interface card, WiMedia, IEEE 802.XX, Bluetooth® or other interface), a communications port (such as for example, a USB port, IR port, RS232 port, or other port), or other communications interface. Software and data transferred via communications interface 624 might typically be carried on signals, which can be electronic, electromagnetic (which includes optical) or other signals capable of being exchanged by a given communications interface 624. These signals might be provided to communications interface 624 via a channel 628. This channel 628 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 608, storage unit 622, media 614, and channel 628. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing system 600 to perform features or functions of the disclosed technology as discussed herein.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various example embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described example embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of example block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A fixed wireless access (FWA) device, comprising:
   a radio module, comprising:
      wireless communication circuitry;
      a universal dock connector; and
      a first heat sink assembly comprising a first set of heat-dissipating fins; and
   a dock, comprising:
      a radio module connector adapted to operatively connect to the universal dock connector providing data transmission and reception between the wireless communication circuitry and an associated communications device;
      a second heat sink assembly operatively connecting to the first heat sink assembly creating an environmental seal therebetween, the second heat sink assembly comprising a second set of heat-dissipating fins; and
      an o-ring to effectuate the environmental seal resulting in an Ingress Protection Code (IPC) 67 degree of protection, the o-ring preventing ingress of environmental debris between the first and second heat sink assemblies.

2. The FWA device of claim 1, wherein the dock further comprises at least one connectivity port.

3. The FWA device of claim 2, wherein the at least one connectivity port comprises a Power over Ethernet (PoE) port.

4. The FWA device of claim 1, wherein the universal dock connector comprises an M.2 connector.

5. The FWA device of claim 1, wherein the dock is configured for outdoor installation.

6. A fixed wireless access (FWA) device, comprising:
   a radio module, comprising:
      wireless communication circuitry;
      a universal dock connector; and
      a first heat sink assembly; and
   a dock, comprising:
      a radio module connector adapted to operatively connect to the universal dock connector providing data transmission and reception between the wireless communication circuitry and an associated communications device; and
      a second heat sink assembly operatively connecting to the first heat sink assembly creating an environmental seal therebetween; and an o-ring sealing a connection between the radio module and the dock.

7. The FWA device of claim 6, wherein the dock further comprises a pressure escape valve.

8. A fixed wireless access (FWA) device, comprising:
   a radio module, comprising:
      wireless communication circuitry;
      a universal dock connector; and
      a first heat sink assembly; and
   a dock, comprising:
      a radio module connector adapted to operatively connect to the universal dock connector providing data transmission and reception between the wireless communication circuitry and an associated communications device; and
      a second heat sink assembly operatively connecting to the first heat sink assembly creating an environmental seal therebetween, wherein the second heat sink assembly is connectable to an adjustable outdoor mounting bracket.

9. The FWA device of claim 8, wherein the adjustable outdoor mounting bracket comprises a first mounting plate operatively connectable to a first surface of the second heat sink assembly opposite a second surface of the second heat sink assembly to which the first heat sink assembly operatively connects.

10. The FWA device of claim 9, wherein the adjustable outdoor mounting bracket comprises a second mounting plate operatively connectable to a mounting surface.

11. A radio module, comprising:
    wireless communication circuitry;
    a universal dock connector providing connectivity between the radio module and a plurality of docks, the plurality of docks comprising indoor installation docks and outdoor installation docks;

an interior heat sink assembly that is connectable to an external heat sink assembly of the outdoor installation docks to create an environmental seal therebetween, and is connectable to a cover such that when the radio module is docked to the indoor installation docks, a gap between the cover and the interior heat sink assembly allow for air ventilation through the radio module.

12. The radio module of claim 11, further comprising a radome integrated into or attachable to a housing of the radio module.

13. The radio module of claim 11, wherein the wireless communication circuitry comprises a 5G modem.

14. The radio module of claim 11, wherein the universal dock connector comprises an M.2 connector.

15. The radio module of claim 11, wherein the interior heat sink assembly comprises a first set of heat-dissipating fins, and the external heat sink assembly comprises a second set of heat dissipating fins.

\* \* \* \* \*